(12) United States Patent
Evans et al.

(10) Patent No.: US 10,955,600 B1
(45) Date of Patent: Mar. 23, 2021

(54) SWINGING NEMATIC LIQUID CRYSTALS AND METHOD FOR MAKING

(71) Applicant: Government of the United States, as Represented by the Secretary of the Air Force, Wright-Patterson AFB, OH (US)

(72) Inventors: Dean R Evans, Beavercreek, OH (US); Ighodalo U Idehenre, Tipp City, OH (US); Nelson V Tabiryan, Winter Park, FL (US); Timothy J Bunning, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 48 days.

(21) Appl. No.: 16/002,279

(22) Filed: Jun. 7, 2018

Related U.S. Application Data

(60) Provisional application No. 62/516,793, filed on Jun. 8, 2017.

(51) Int. Cl.
  *G02B 5/30* (2006.01)
  *H05K 1/02* (2006.01)
  (Continued)

(52) U.S. Cl.
  CPC ............ *G02B 5/3016* (2013.01); *G02F 1/135* (2013.01); *G02F 1/1334* (2013.01);
  (Continued)

(58) Field of Classification Search
  CPC ................... G02F 1/135; G02F 1/1354; G02F 2001/1357; G02F 1/1334; H05K 3/4644;
  (Continued)

(56) References Cited

U.S. PATENT DOCUMENTS

| 5,231,521 | A | * | 7/1993 | Johnson | ............. | G02F 1/13473 349/117 |
| 9,188,820 | B1 | * | 11/2015 | Evans | .................. | G02F 1/1354 |

(Continued)

OTHER PUBLICATIONS

Sarkissian, H, Longitudinally modulated nematic bandgap structure, J. Opt. Soc. Am. B, vol. 23, No. 8, Aug. 2006.

(Continued)

*Primary Examiner* — Anthony J Frost
(74) *Attorney, Agent, or Firm* — AFMCLO/JAZ; Timothy M. Barlow

(57) ABSTRACT

A spectrally-selective reflective optical film comprises at least two anisotropic layers, each of the layers having a phase retardation value and an optical axis orientation pattern within the layer; the optical axis orientation patterns exhibiting a discontinuity at the boundary of the at least two layers; and at least one substrate holding the film. At least a part of the anisotropic layers may be chiral. The materials comprising the anisotropic layers may be selected from liquid crystal polymers, azobenzene liquid crystal polymers, liquid crystals, azobenzene liquid crystals, polymer films with stressed birefringence, and combinations thereof. The materials comprising the anisotropic layers may be doped with at least one dopant from the list comprising nanorods, photorefractive nanoparticles, photovoltaic nanoparticles, lasing dyes, and combinations of thereof. The anisotropic layers may be transparent to infrared wavelengths. The anisotropic layers may be arranged in a periodic pattern of retardation values, including zero.

17 Claims, 14 Drawing Sheets
(13 of 14 Drawing Sheet(s) Filed in Color)

(51) Int. Cl.
*G02F 1/135* (2006.01)
*H05K 3/46* (2006.01)
*G02F 1/1334* (2006.01)

(52) U.S. Cl.
CPC .... *G02F 1/1354* (2013.01); *G02F 2001/1357* (2013.01); *H05K 1/028* (2013.01); *H05K 3/4644* (2013.01); *H05K 2201/10128* (2013.01)

(58) Field of Classification Search
CPC ................. H05K 1/028; H05K 1/185; H05K 2201/10128; G02B 5/3016
See application file for complete search history.

(56) References Cited

U.S. PATENT DOCUMENTS

| 2012/0052421 A1* | 3/2012 | Liu | C09K 19/12 430/20 |
| 2013/0120678 A1* | 5/2013 | Chao | G02F 1/01 349/34 |

OTHER PUBLICATIONS

Sarkissian, H., Polarization-universal bandgap in periodically twisted nematics, Optics Letters, vol. 31, No. 11, Jun. 2006.

\* cited by examiner $$\#slices = 100 \quad r = \frac{\lambda}{p_0}$$

$$z_m = z_0 + m\frac{h}{2} \quad h = \frac{p_0}{\#slices}$$

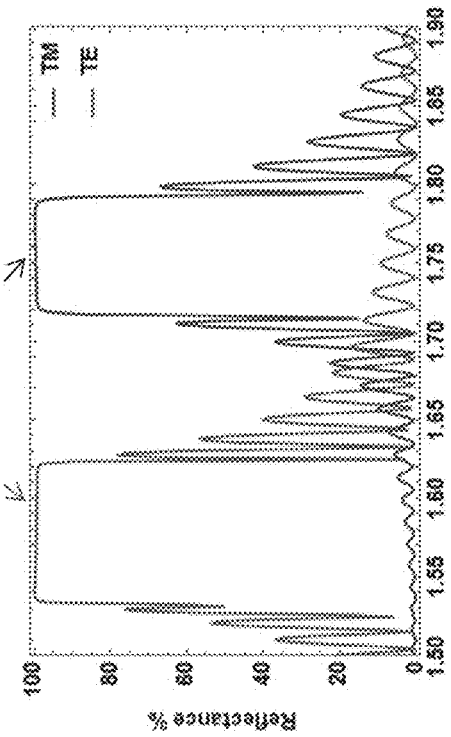
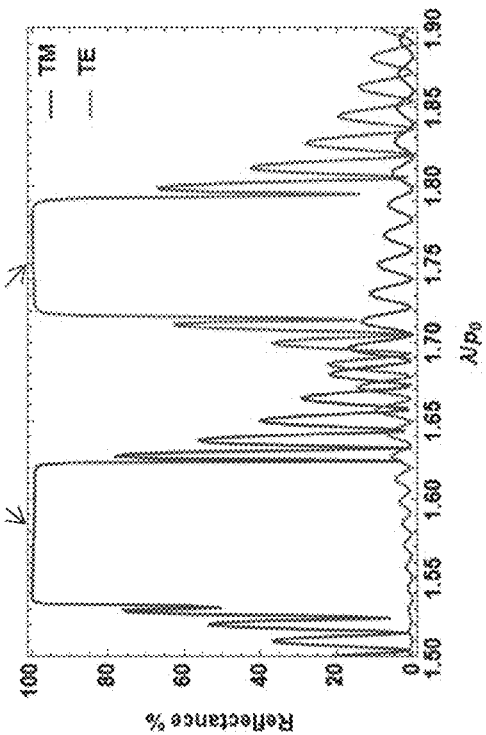
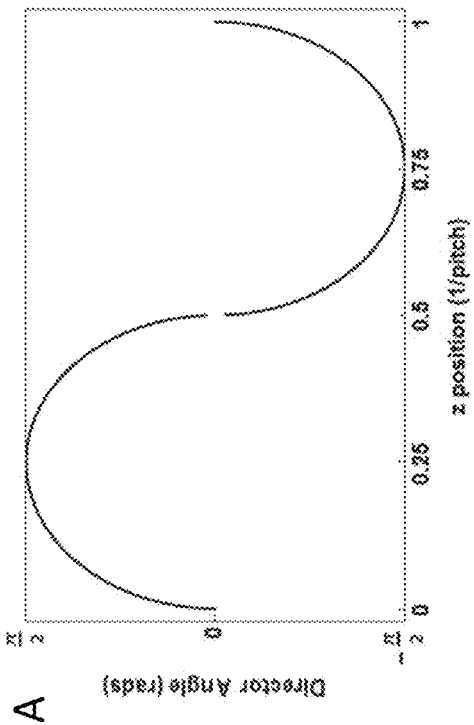
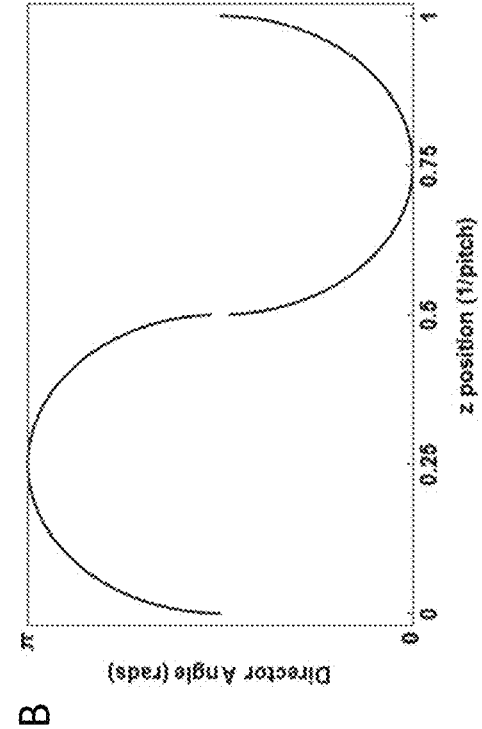
FIG. 6A
FIG. 6B

SWINGING NEMATIC LIQUID CRYSTALS AND METHOD FOR MAKING

Pursuant to 37 C.F.R. § 1.78(a)(4), this application claims the benefit of and priority to prior filed Provisional Application Ser. No. 62/516,793, filed 8 Jun. 2017, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to liquid crystals and, more particularly, to swinging nematic liquid crystals, photonic bandgap films, and methods of fabrication.

BACKGROUND OF THE INVENTION

Traditional Cholesteric Liquid Crystal Material Systems generate a reflection notch (optical filter), but they are polarization dependent and work with circularly polarized light. Cholesteric liquid crystals (CLCs) are materials with easily tunable optical band gap. The band gap feature is polarization dependent, determined by the chirality of the liquid crystal molecules. It is desirable to overcome this limitation.

SUMMARY OF THE INVENTION

The present invention overcomes the foregoing problems and other shortcomings, drawbacks, and challenges of liquid crystals, and this invention describes the concept of swinging nematic liquid crystals using various index profiles to generate polarization independent Bragg-stacks that can reflect multiple polarization states. While the invention will be described in connection with certain embodiments, it will be understood that the invention is not limited to these embodiments. To the contrary, this invention includes all alternatives, modifications, and equivalents as may be included within the spirit and scope of the present invention.

Traditional Cholesteric Liquid Crystal Systems generate a reflection notch (optical filter), but they are polarization dependent and block only about 50% of light, i.e. about 100% of either left-handed or right-handed circularly-polarized light while letting nearly 100% of the other transmit. Light having polarization states that are a mix of the two, left-handed and right-handed, such as linear and elliptical, will always have some non-zero transmission. Cholesteric liquid crystals (CLC) are easily-tunable optical band gap materials. The band gap feature is polarization dependent, and determined by the chirality of the liquid crystal molecules.

To overcome this limitation, one possible solution is to control and/or eliminate the polarization dependence using swinging nematic liquid crystals (SNLC). Swinging Nematics exhibit polarization independence, and SNLC systems resolve the issue of polarization dependence, while maintaining the tunability of traditional CLCs. SNLC systems work with light having circular, elliptical, and linear polarizations, resulting in narrow or broad band reflection ranging from 0 to ~100% tunable notches, in any desired amount up to 100%, depending upon the particular configuration.

Advances in polymer-based liquid crystals may grant access to more unique liquid crystal geometries and phases. With known techniques to create tunable cholesteric liquid crystal (CLC) filters, it is possible to fabricate either switchable or tunable swinging nematic liquid crystal filters. As with most other CLC filters, the light wavelength must be known a priori and the tuning must be controlled by an electrical device. This concept is disclosed below, and may also have applications as passive filters where an autonomously tuning mechanism is employed.

SNLC patterns offer several benefits over their CLC counterparts such as polarization independence and control.

Sharp waveform patterns (square, triangle) can produce well defined polarization independent bandgaps, while gently-changing patterns (sinusoidal, cycloidal) produce peaks with strong polarization dependent side bands.

SNLCs are demonstrated to function as linear polarizers in the same way that traditional CLCs act as circular polarizers.

Techniques beyond waveform shaping, such as apodizing and chirping, can further help tailor the shape of bandgap features in SNLCs.

SNLCs may be incorporated into more sophisticated optical devices, e.g. band pass filters, notch filters, and broad band linear polarizers, simplifying their designs compared to traditional dielectric stacks.

SNLCs offer refractive index profiles that allow for polarization independence (different orthogonal polarizations and functionality as linear, circular, or elliptical polarizers) for normal and off-axis light propagation. This is in contrast to traditional cholesteric liquid crystals, which are capable of blocking only one component of a pair of orthogonal polarization states, giving only a 50% reflection for unpolarized or linearly polarized light.

SNLC's linear and nonlinear patterning is able to overcome the limitations of traditional cholesteric liquid crystals, resulting in 100% reflection regardless of polarization conditions.

SNLCs exhibit narrow and broad band 100% rejection notches, such as may be used in optical filters.

SNLCs exhibit more advanced nonlinear patterning (as opposed to simple sinusoidal patterning), which offers 100% reflections notches that block linearly-polarized light.

SNLCs may also be used for complex nonlinear patterns (waveforms):

Cycloidal patterns: These type of patterns display 100% reflection of either the TM or TE (linear) polarization states. Individually, a cycloidal pattern behaves as a simple linear polarizer, but specific patterns based on this type may also be used to produce polarization-independent band pass features.

Apodized patterns: these types of patterns suppress activity outside of the bandgaps (reflection bands) and sharpen the spectral edges. Apodized patterns may also be used to expand the band width of the bandgap features.

Chirped patterns (making the pitch a function of position): constructs broadband gap features that may be used in broadband filter applications or for pulse-shaping applications.

SNLCs may include 1-D, 2-D, and 3-D modulation (multidirectional, x, y, and z axes), and their effects include more than reflection notches, such as diffraction, scattering, lensing.

An SNLC structure may include a grating comprising at least one anisotropic material layer wherein the orientation of the anisotropy axis in the material layer is rotating along at least two axes, the rotation periodically changing sign for at least one axis.

SNLCs may be incorporated into optical films having spectrally-selective reflection.

According to one embodiment of the present invention, a spectrally-selective reflective transparent optical film comprises: at least two thin planes of anisotropic aligned liquid crystal layers, each of the layers having a phase retardation value and an optical axis orientation pattern within the layer; the optical axis orientation patterns exhibiting a discontinuity at the boundary of the at least two different layers. A substrate, e.g. glass, may be used to hold or support the film during or after manufacturing. In some embodiments, only some of the layers have an optical axis orientation pattern. The optical axis orientation patterns are defined as the direction that the long axis of a given liquid crystal molecule is pointing at a given position. Such orientations may be different from layer to layer, exhibiting a discontinuity at the boundary of the layers.

According to a first variation of the invention, at least a part of the anisotropic layers are chiral.

According to another variation of the invention, the materials comprising the anisotropic layers are selected from liquid crystal polymers, azobenzene liquid crystal polymers, liquid crystals, azobenzene liquid crystals, polymer films with stressed birefringence, and combinations thereof.

According to a further variation of the invention, the materials comprising the anisotropic layers are doped with at least one dopant from the list comprising nanorods, photorefractive nanoparticles, photovoltaic nanoparticles, lasing dyes, and combinations of thereof.

According to another variation of the invention, the anisotropic layers are transparent to infrared wavelengths.

According to a further variation of the invention, the anisotropic layers are arranged in a periodic pattern of retardation values. These patterns correspond to the director angle, such as those presented in the Figures and described below.

According to another variation of the invention, the periodic pattern of retardation values includes 0 (zero).

According to a further variation of the invention, the anisotropic layers are arranged in a periodic pattern of anisotropy axis orientation. These patterns correspond to the director angle, such as those presented in the Figures.

According to another variation of the invention, the period of the periodic pattern of retardation values varies across the film in a nonlinear manner.

According to a further variation of the invention, the at least two anisotropic layers have phase retardation values selected to meet a half-wave phase retardation condition for a laser wavelength.

According to another variation of the invention, an optical axis orientation formed by the at least two anisotropic layers is one of: square, apodized square, triangle, apodized triangle, cycloid, apodized cycloid, and sinusoid. These patterns correspond to the director angle, such as those presented in the Figures, and described below.

According to a further variation of the invention, at least one of the characteristics of the birefringent layers, phase retardation value, and optical axis orientation pattern, are controllable by optical radiation, e.g. UV radiation and its polarization.

According to another variation of the invention, the film further comprises a transparent electro-conductive coating on at least one of the anisotropic layers. The transparent electro-conductive coating may comprise one or more of indium tin oxide (ITO), fluorine-doped tin oxide (FTO), aluminum-doped zinc oxide (ZnO:Al), and other inorganic conductors, as well as poly(3,4-ethylenedioxythiophene), polystyrene sulfonate (PDOT:PSS), polycarbazoles (PVK), polyfluorene, and other organic conductors.

According to a further variation of the invention, the optical axis orientation pattern is controlled by application of an electric field.

According to another variation of the invention, the architecture of the film characterized by phase retardation value and optical axis orientation patterns within the birefringent layers provides polarization independent reflection properties.

According to a further variation of the invention, the architecture of the film provides polarization independent reflection properties in a narrow band of wavelengths.

According to another variation of the invention, the architecture of the film provides broad band polarization independent reflection properties for normal and off-axis incidence.

According to a further variation of the invention, the architecture of the film provides near 100% reflection of a linearly polarized light and near 100% transmission for an orthogonally linear polarized light beam.

According to another variation of the invention, the optical axis orientation patterns within the layers are at least two dimensional.

According to a second embodiment of the present invention, a linear polarizer comprises the optical film comprising at least two planes of anisotropic layers, each of the layers having a phase retardation value and an optical axis orientation pattern within the layer; the optical axis orientation patterns exhibiting a discontinuity at the boundary of the at least two different layers. At least one substrate may be included to hold or support the film. The substrate may be a material that is at least partially transparent, e.g. glasses and plastics.

According to a third embodiment of the present invention, a method for fabricating a transparent optical film having spectrally-selective reflection properties, comprises (a) providing a substrate; (b) depositing a first layer of a photoalignment material over the substrate; (c) recording a first photoalignment pattern on the first photoalignment material layer by exposing the photoalignment material to a linearly-polarized light; (d) depositing a liquid crystal monomer over the patterned photoalignment material; (e) producing a first polymer layer by polymerizing the liquid crystal monomer; (f) depositing a second layer of a photoalignment material over the first polymer layer; and (g) recording a second photoalignment pattern on the second photoalignment material layer by exposing the second photoalignment material layer to a linearly-polarized light. The photoalignment material may be azobenzone, but many others are known in the art. The second photoalignment material layer may be the same or a different material from the first photoalignment material layer. The second photoalignment pattern may be distinct from the first photoalignment pattern. The different patterns may be achieved by rotating the linearly-polarized light or by physically patterning the layers distinctly.

According to fourth embodiment of the invention, a method for fabricating a transparent optical film having spectrally selective reflection properties comprises: (a) providing a substrate; (b) depositing an alignment material over the substrate; (c) producing an alignment condition in the alignment material; (d) depositing a liquid crystal monomer over the alignment material; (e) producing a first polymer layer by polymerizing the liquid crystal monomer (either thermally, optically, or via exposure to ions such as corona discharge); (f) depositing a second alignment material over the first polymer layer; (g) producing a second alignment condition in the second alignment material; (h) depositing a second liquid crystal monomer over the second alignment material; (i) producing a second polymer layer by polymerizing the second liquid crystal monomer; and (j) repeating the process for subsequent liquid crystal monomer layers. An alignment condition includes the condition where the average direction of the long axis of the liquid crystal molecules in a desired region is pointing in a desired direction. The liquid crystal monomers may be polymerized thermally, optically, or via exposure to ions such as corona discharge. The substrate, in this embodiment or any of the other embodiments described herein, may be removed after the film is made, or the substrate may be incorporated into the final structure or product.

According to another variation of the invention, the alignment material is a photoalignment material.

According to a further variation of the invention, producing the alignment condition includes exposing the photoalignment material to a linearly-polarized light.

According to another variation of the invention, the method for fabricating a transparent optical film further comprises modulating the linearly-polarized exposure light.

According to a further variation of the invention, the alignment material is a polyimide and the alignment condition is produced by rubbing. Rubbing may be a mechanical process accomplished with a felt cloth.

According to a fifth embodiment of the invention, a method for fabricating a transparent optical film having spectrally-selective reflection properties, comprises: (a) providing a plurality of substrates including at least a first substrate and a second substrate; (b) depositing a release layer on each of the plurality of substrates except the first substrate; (c) depositing an alignment material over the plurality of substrates; (d) producing an alignment condition in the alignment materials of each of the plurality of substrates; (e) depositing a liquid crystal monomer layer over the alignment materials on the plurality of substrates; (f) producing a polymer layer from each liquid crystal monomer layer by polymerizing the liquid crystal monomers on the plurality of substrates; (g) depositing an adhesive layer over a first liquid crystal polymer layer of the first substrate; (h) attaching the second substrate to the first substrate so that the second liquid crystal monomer layer is facing the first liquid crystal monomer layer with a desired alignment; (i) curing the adhesive layer; and (j) removing the second substrate so that the second liquid crystal polymer film remains attached to the first liquid crystal polymer film on the first substrate. The desired alignment of the liquid crystal monomer layers may be achieved by rubbing or via exposing the photo alignment layer According to another variation of the invention, the method for fabricating a transparent optical film further comprises: (k) repeating the process with the remaining plurality of substrates having respective liquid crystal polymer layers to form a multilayer liquid crystal polymer film structure.

According to a sixth embodiment of the invention, a method for fabricating a transparent optical film having spectrally-selective reflection properties comprises: (a) providing a multitude of polymer films; (b) inducing birefringence in each of the polymer films by applying a stress; and (c) laminating the multitude of stress-induced birefringent polymer films with each other at a predetermined alignment. The alignment of the anisotropic, i.e. birefringent, layers may be determined through the use of two crossed polarizers.

According to another variation of the invention, the polymer film comprises infrared transparent polymers, including cyclic olefin copolymer, polyethylene, and high-density polyethylene.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication with color drawing(s) will be provided by the Office upon request and payment of the necessary fee.

Swinging Nematic Liquid Crystals exhibit anomalous refractive index profiles for polarization-independent optical filters. Typical cholesteric liquid crystals (CLCs) have a linear variation in the director angle with respect to their polarization dependence; typical CLCs respond to a single handedness of circular polarization. In contrast, swinging nematic liquid crystals (SNLCs) are polarization-independent, and under certain conditions, they reflect linear polarization, which is not possible with CLCs. Swinging Nematic Liquid Crystals (SNLC) are a special class of CLCs that periodically change handedness when propagating along the helical axis. Unlike typical, standard CLCs which can only reflect one circular polarization state while allowing the other polarization state to pass, SNLCs are able to reflect both polarization states simultaneously, including linearly-polarized light.

Figure 1:
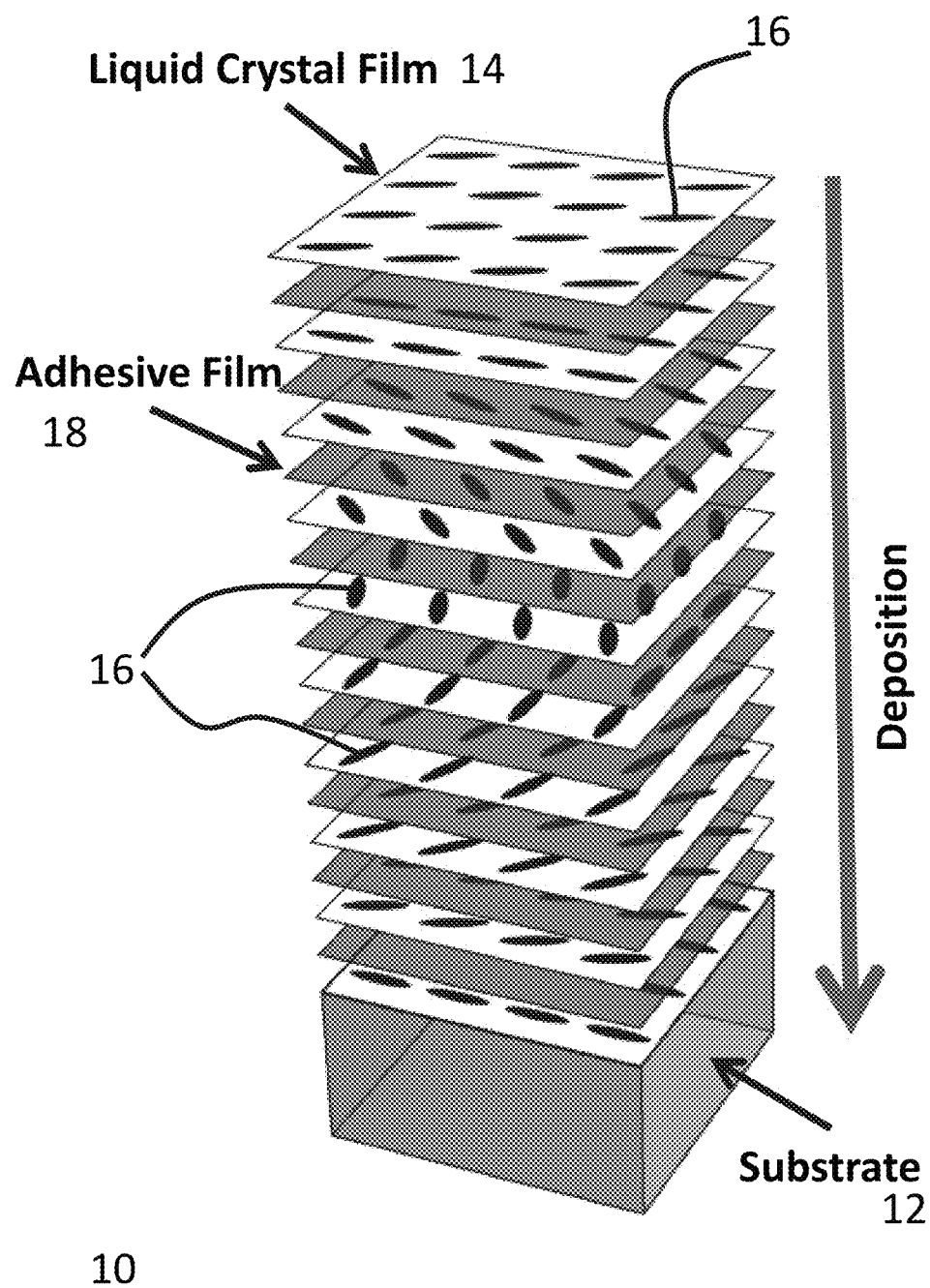

SNLC systems resolve the issue of polarization dependence while maintaining tunability/switchability of traditional CLC systems. SNLC patterns offer several benefits over their CLC counterparts, such as polarization independence and control. SNLC's sharp waveform patterns (square, triangle) produce well-defined polarization-independent bandgaps while smoothly changing patterns (sinusoidal, cycloidal) to produce peaks with strong polarization-dependent secondary side bands at desired wavelengths. It is possible to design the structure to a polarization dependence based on any set of orthogonal polarization states, i.e. linear, elliptical, or circular.

SNLCs are demonstrated to function as linear polarizers in the same way that traditional CLCs act as circular polarizers. Techniques beyond waveform shaping, such as apodizing and chirping, may be used to further help tailor the shape of bandgap features in SNLCs. SNLCs may be used to produce more sophisticated optical devices such as band pass filters, notch filters, and broad band linear polarizers. Such devices require less complex designs, fewer materials, and are far simpler to fabricate, compared to traditional dielectric stacks.

SNLCs may include refractive index profiles that allow for polarization independence (different orthogonal polarizations) and can function as linear, circular, or elliptical polarizers) for both normal and off-axis light propagation. This is in contrast to traditional CLCs which block only one component of a pair of orthogonal polarization states, yielding only a 50% reflection for unpolarized or linearly-polarized light. Linear and nonlinear patterning for SNLCs is demonstrated to overcome the limitations of traditional cholesteric liquid crystals, and yielding ~100% tunable reflection regardless of polarization conditions.

SNLCs may be used to provide both narrow and broad band ~100% tunable rejection notches, such as when they are utilized in optical filters. SNLCs also exhibit more-advanced nonlinear patterning than merely simple sinusoidal patterning, which yields 100% reflection notches that block linearly-polarized light.

Complex nonlinear patterns (waveforms), e.g. cycloidal, apodized, and chirped, are described below. Cycloidal-type patterns display ~100% tunable reflection of either the TM or TE (linear) polarization states. Individually, a cycloidal pattern behaves as a simple linear polarizer, but specific patterns based on this type may also be used to produce polarization-independent band pass features. Apodized-type patterns suppress activity outside of the bandgaps (reflection bands) and sharpen the spectral edges. Apodized patterns may also expand the bandwidth of the bandgap features. In chirped-type patterns (making the pitch a function of position) broadband gap features may be used in broadband filter applications or for pulse-shaping applications. Such teachings can be extended to include 1-D, 2-D, and 3-D modulation (multidirectionall x, y, and z axes), and the effects include more than reflection notches, e.g. diffraction, scattering, and lensing.

An SNLC apparatus may comprise a grating that includes at least one anisotropic material layer, wherein the orientation of the anisotropy axis in the material layer is rotating along at least two axes, and the rotation is a periodically-changing sign for at least one axis.

Figure 2:
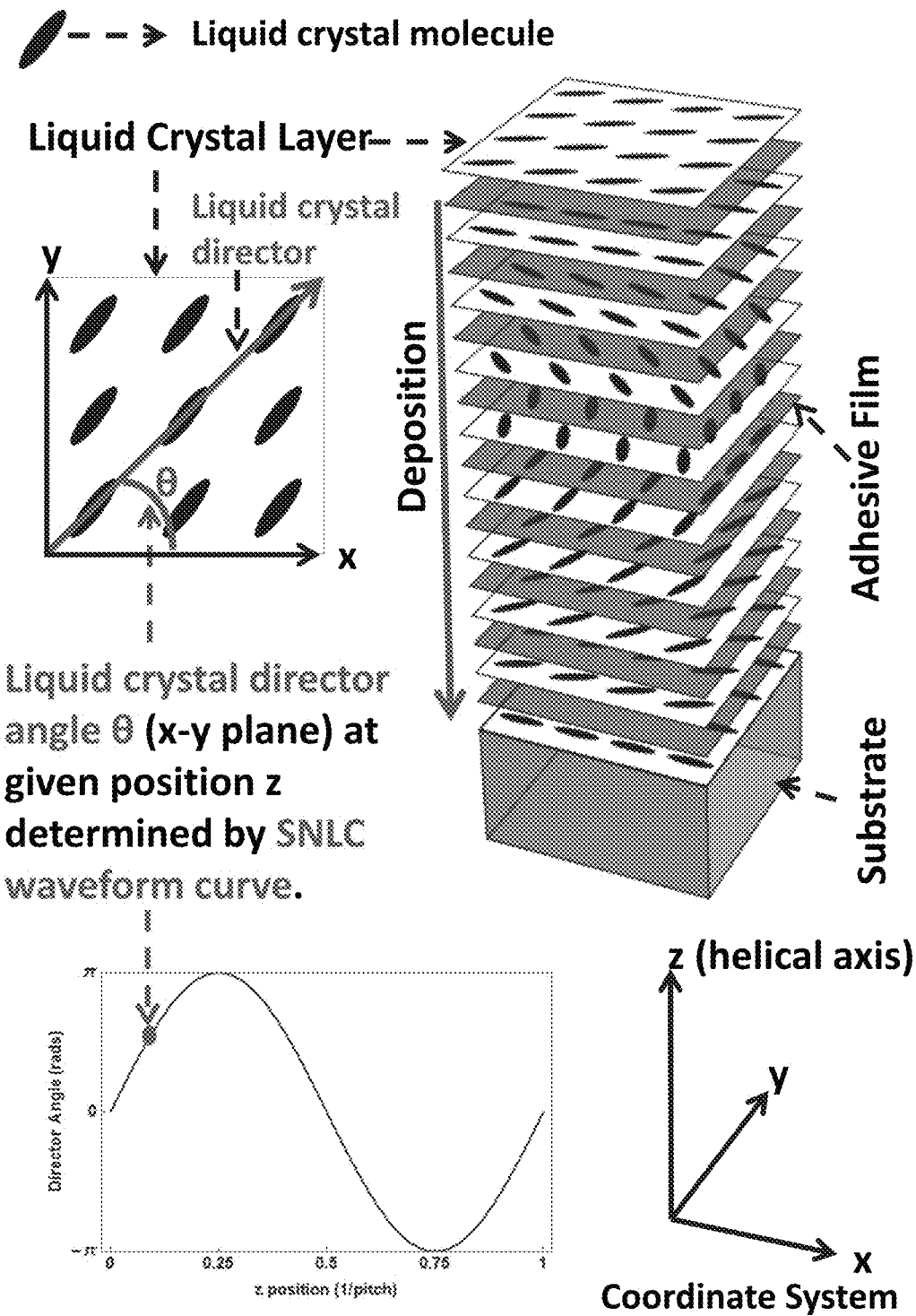
Figure 3:
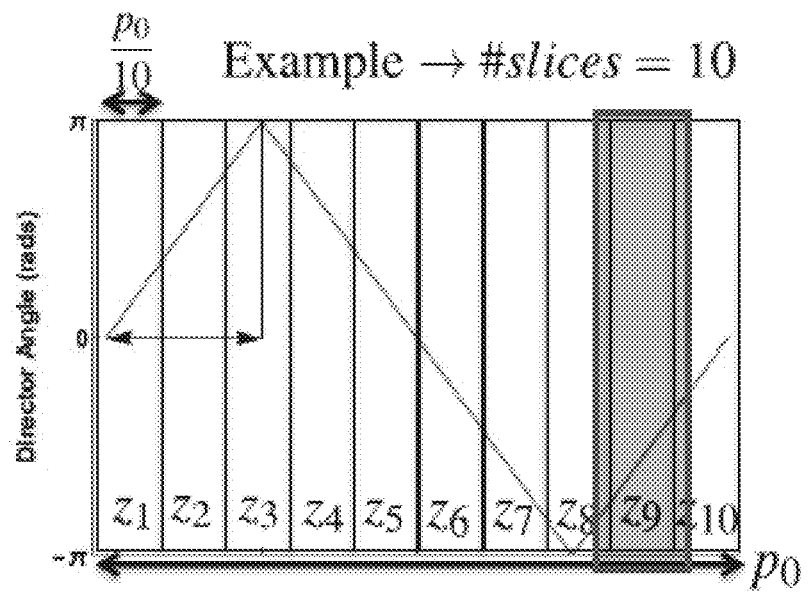
Figure 4A:
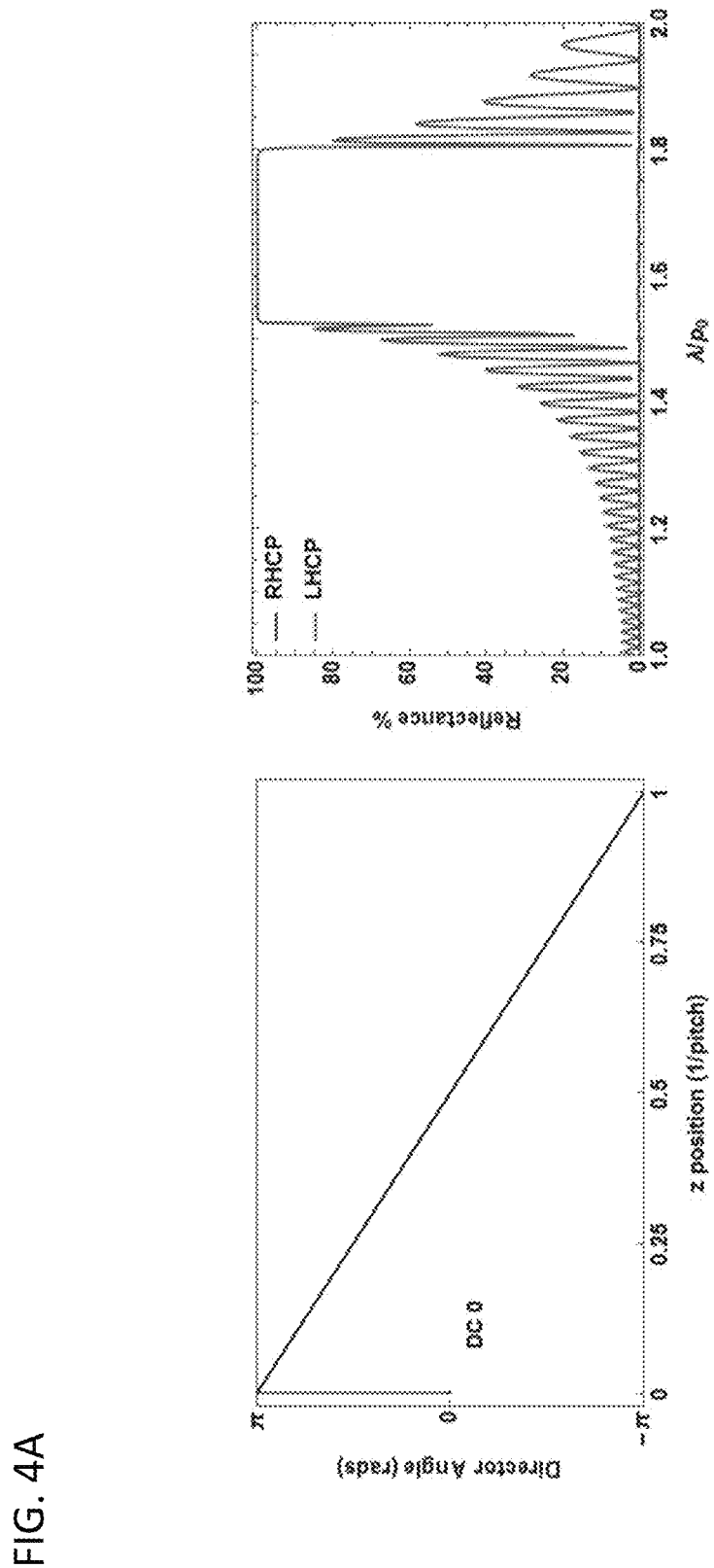
Figure 4B:
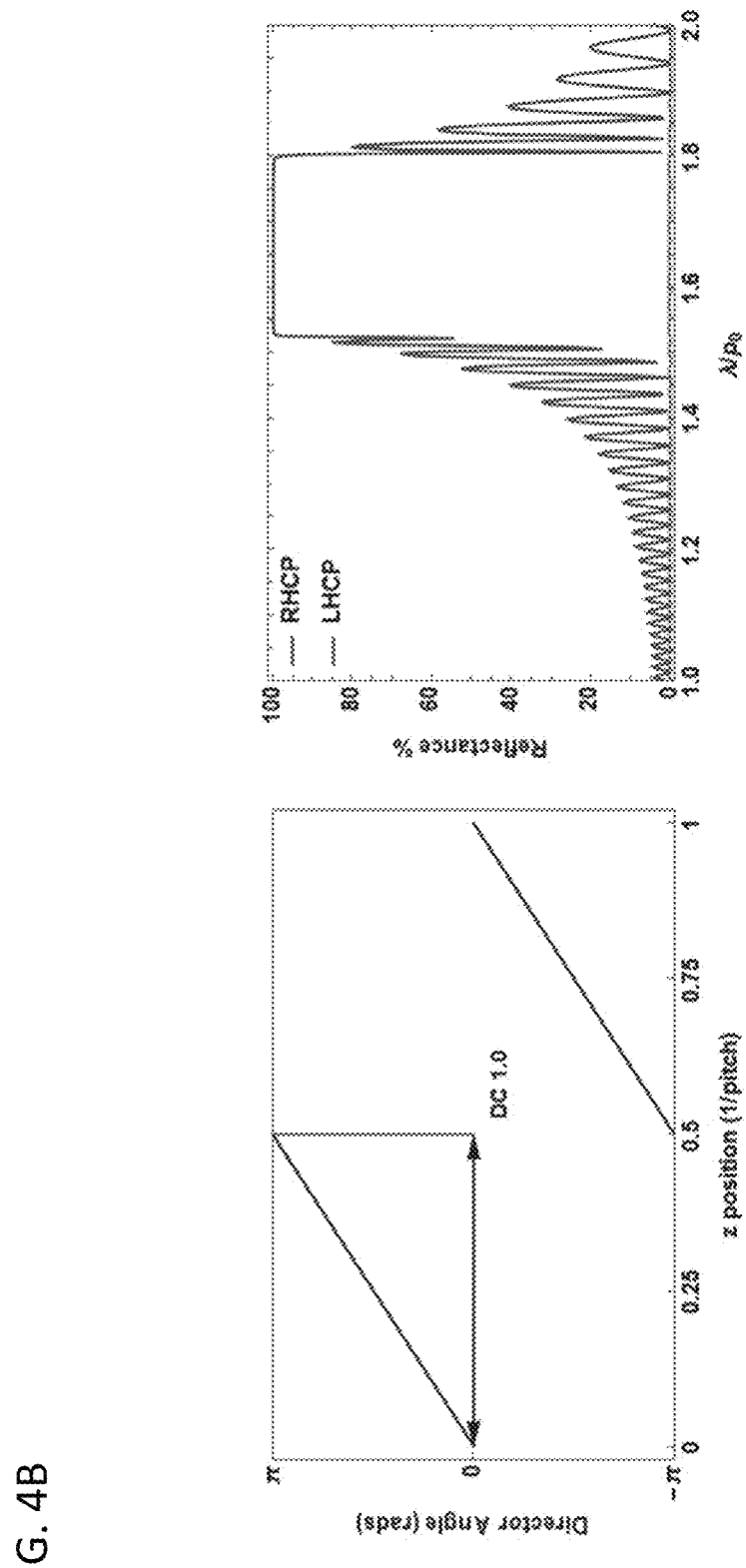
Figure 4C:
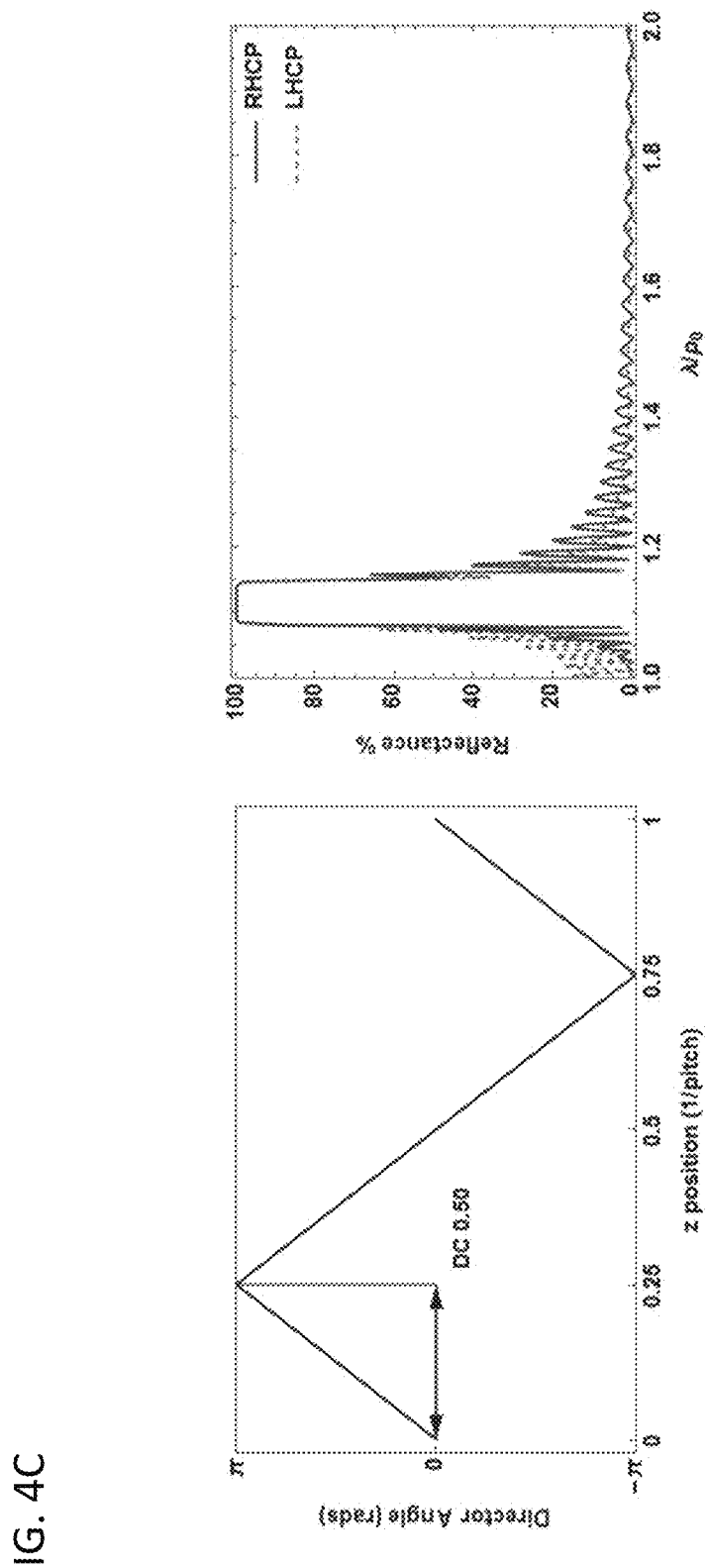
Figure 5:
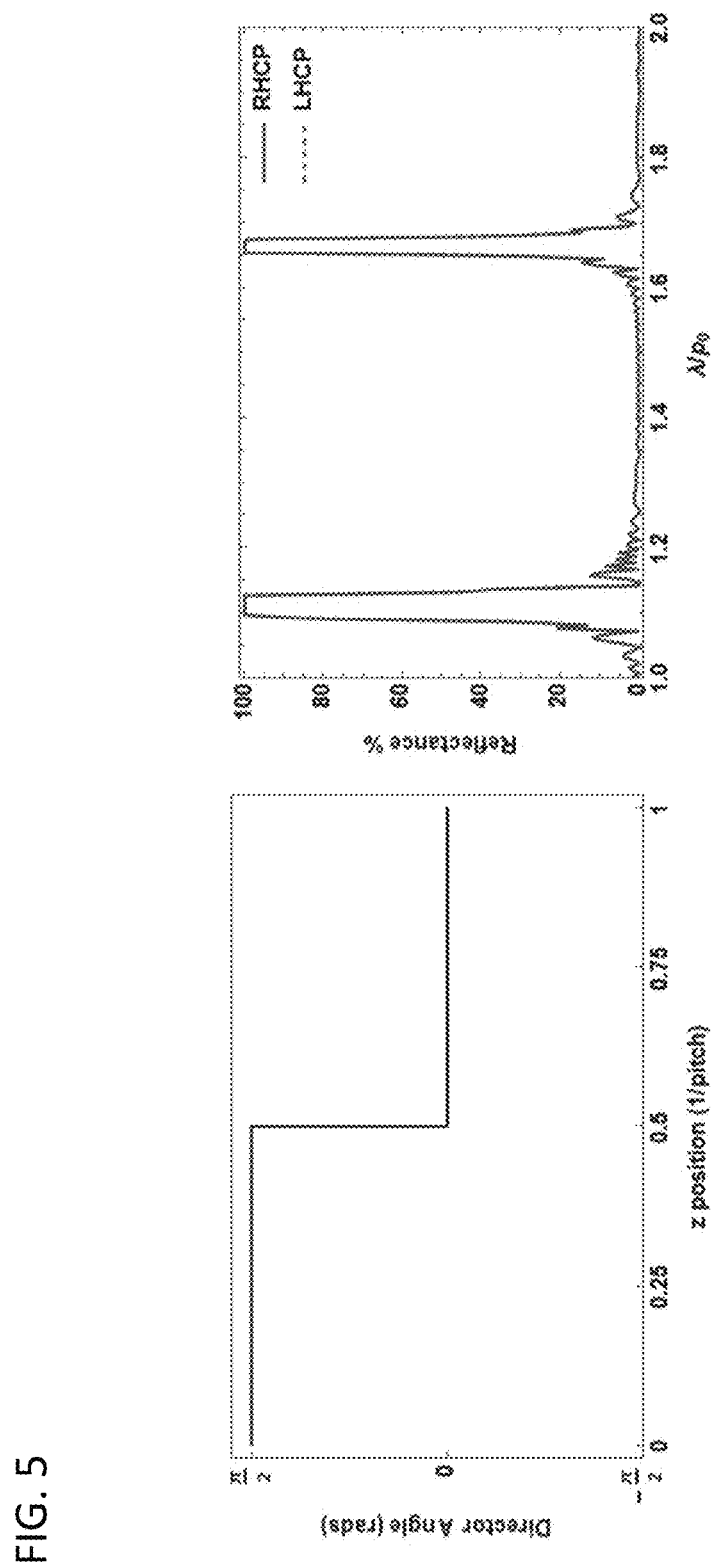
Figure 7:
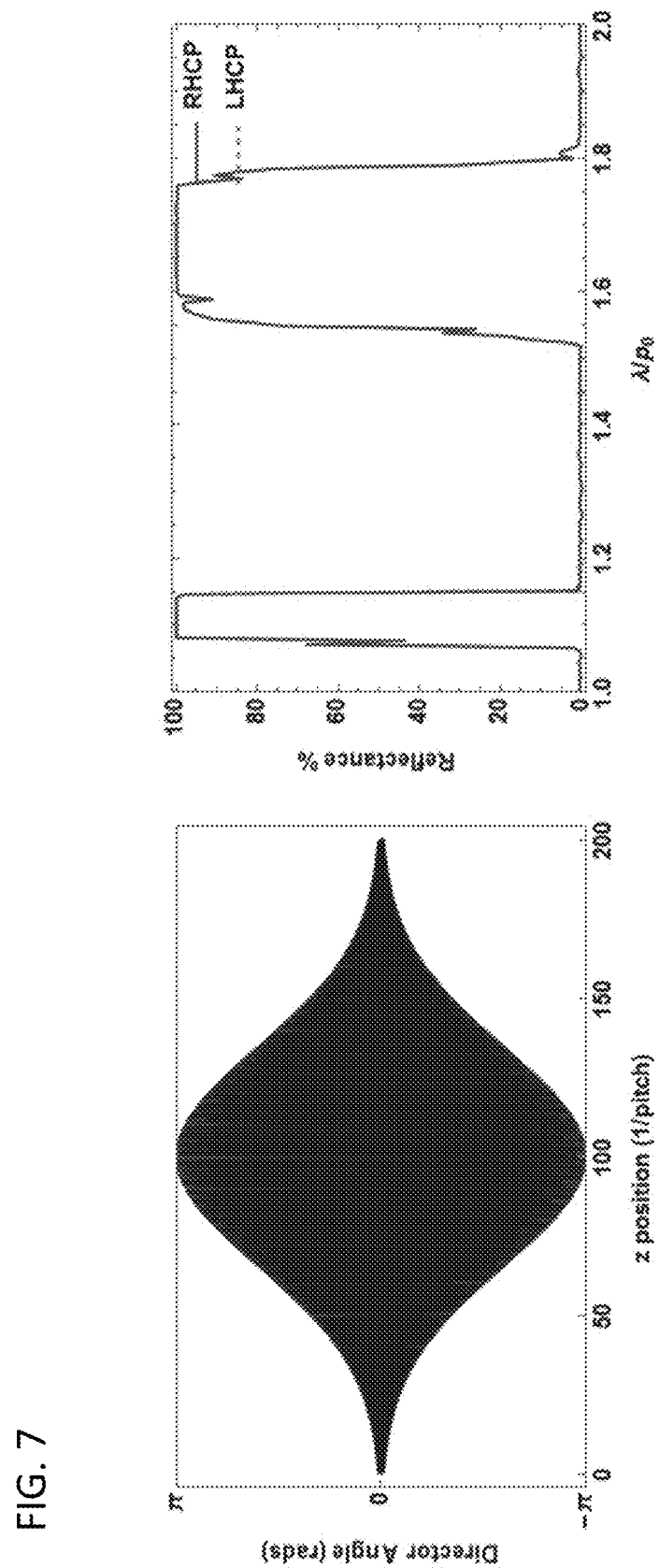
Figure 8:
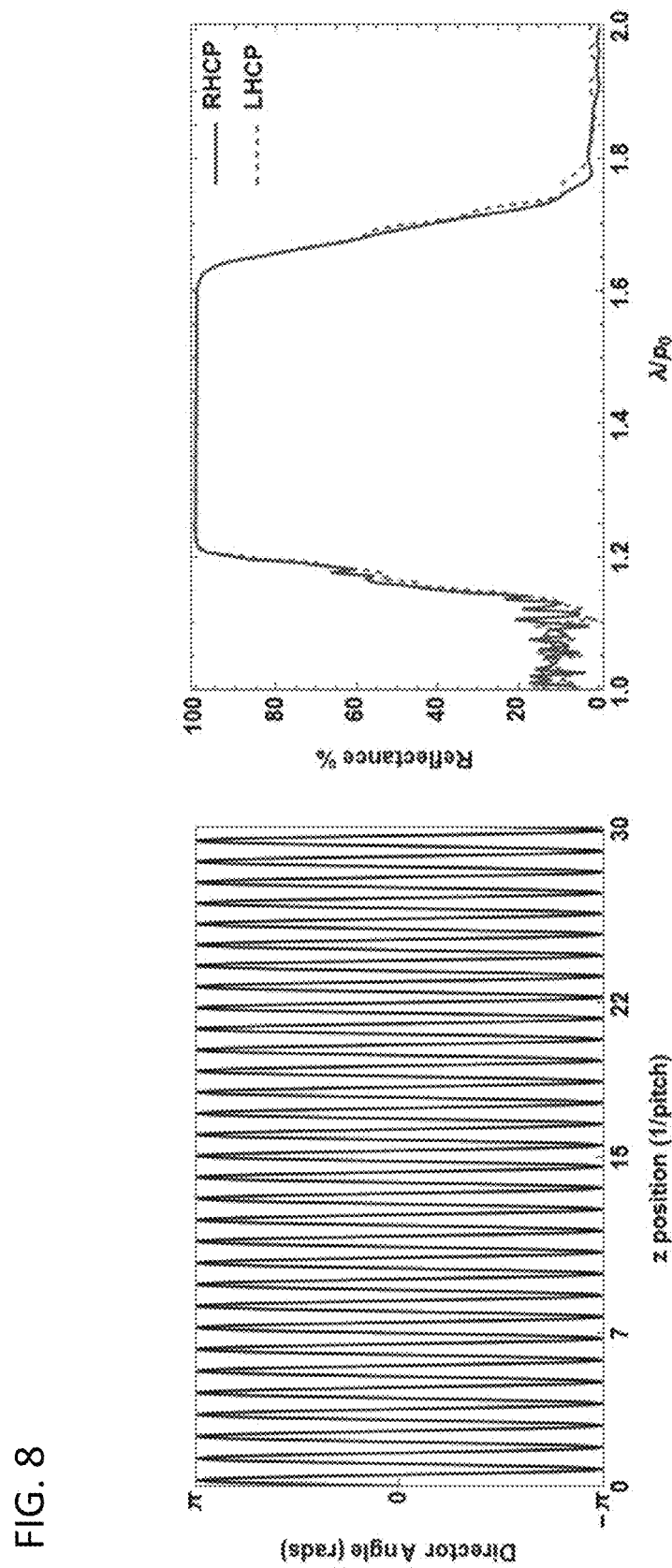
Figure 9:
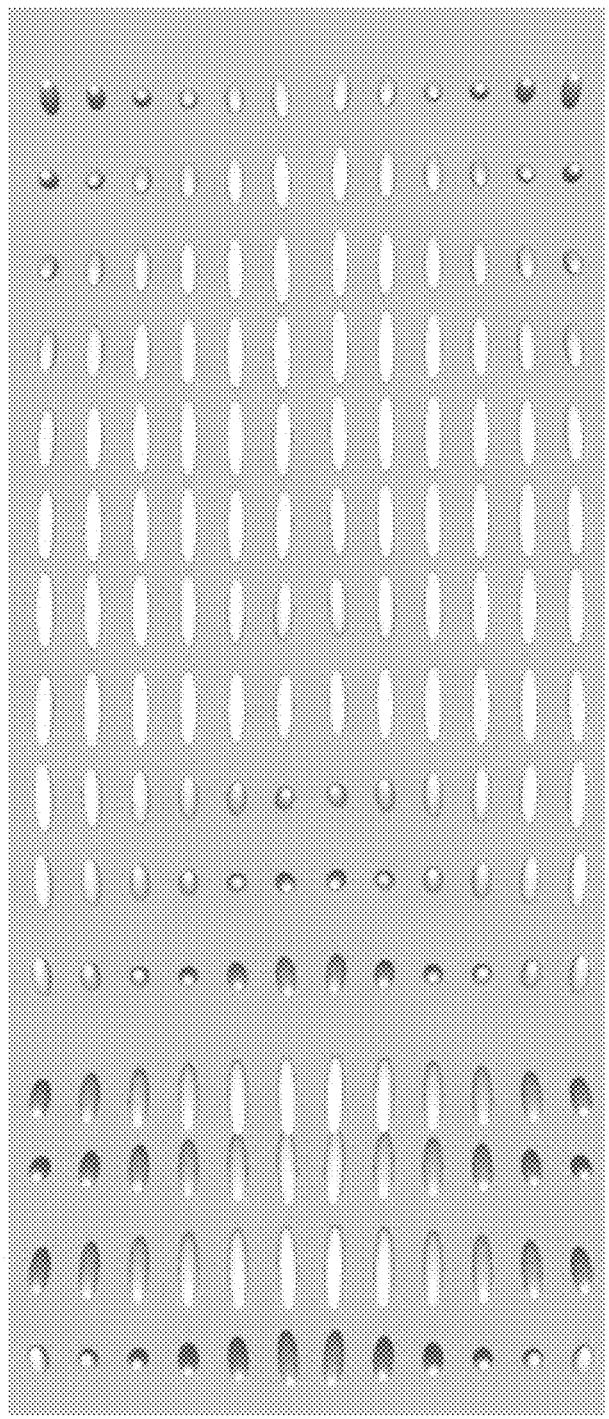
Figure 10:
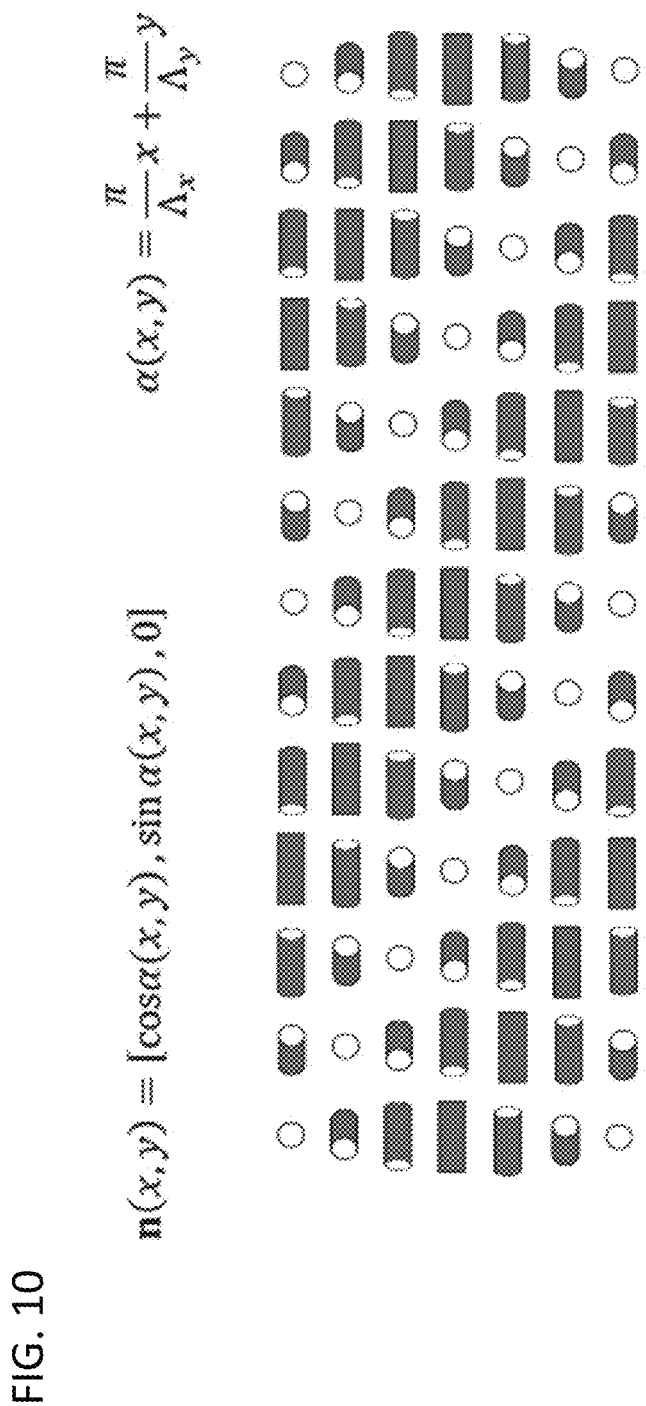
Figure 11:
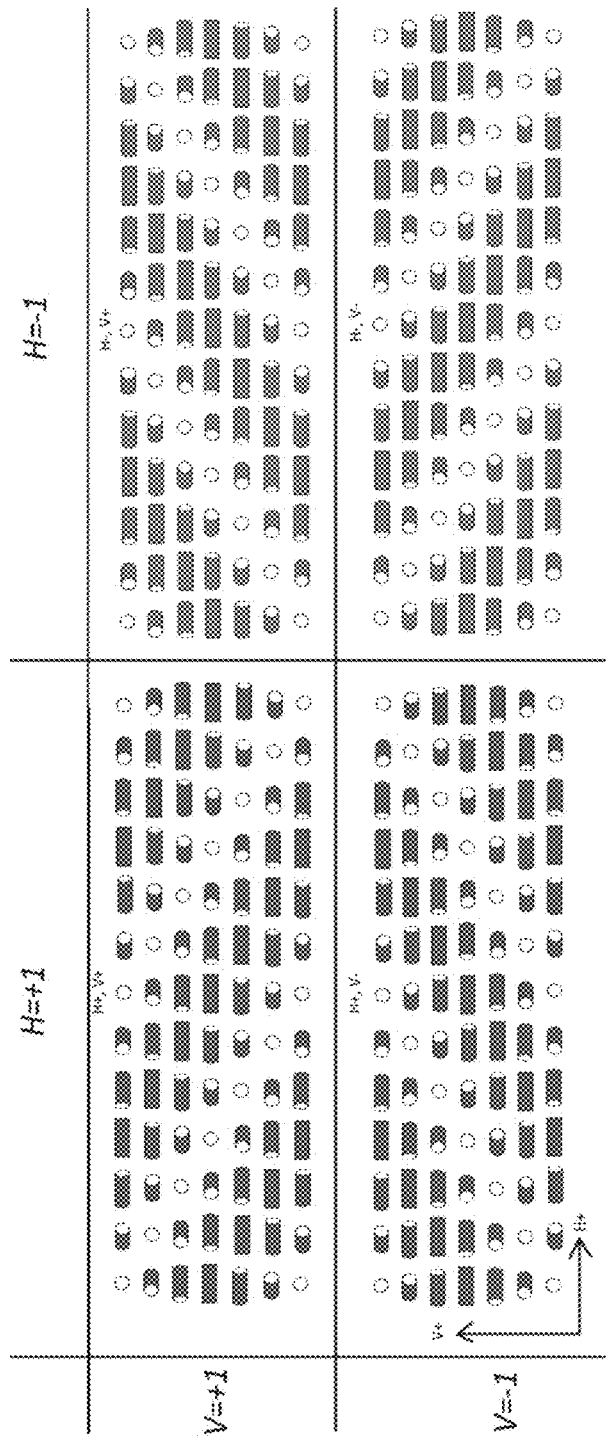

FIGS. 1-2 illustrate a multilayer assembly of a SNLC liquid;

FIG. 3 illustrates simulation parameters used to calculate the transmission spectrum from the SNLCs, according to an embodiment of the invention;

FIGS. 4A-4C illustrate reflectance characteristics for CLCs and SNLCs having a triangle wave pattern, according to an embodiment of the invention;

FIG. 5 illustrates reflectance characteristics for a square wave pattern for SNLCs, according to an embodiment of the invention;

FIGS. 6A-6B illustrate reflectance characteristics for a cycloidal wave pattern for SNLCs, according to an embodiment of the invention;

FIG. 7 illustrates reflectance characteristics for an apodized pattern for SNLCs, according to an embodiment of the invention;

FIG. 8 illustrates reflectance characteristics for a chirped structure for SNLCs, according to an embodiment of the invention;

FIG. 9 illustrates an SNLC applied in a polarization transmission grating scheme, according to an embodiment of the invention;

FIG. 10 illustrates a single sign element for swinging nematic liquid crystals, according to an embodiment of the invention; and FIG. 11 illustrates four distinct architectures of double-twisted nematic liquid crystals, a variation of the SNLC, according to an embodiment of the invention.

Figure 12:
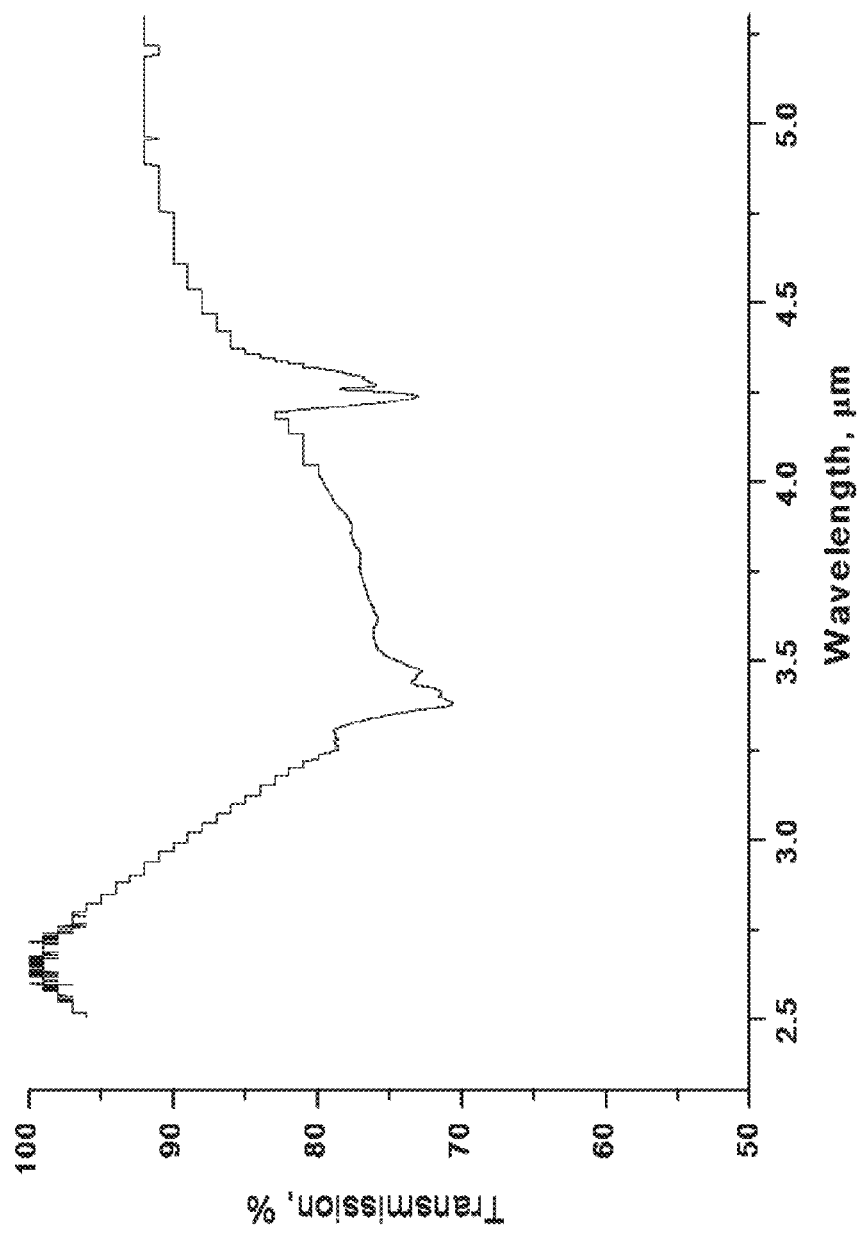

FIG. 12 illustrates the transmission characteristics of a Swinging Nematic Liquid Crystal structure comprising 6 LCP layers in an alternating, mutually-orthogonal orientation, according to an embodiment of the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

A liquid crystal cell comprises glass or crystalline windows that are coated with transparent electrodes. Nematic liquid crystals are patterned with various waveforms having periodic or aperiodic, linear or nonlinear orientations.

FIGS. 1-2 illustrate a typical swinging nematic liquid crystal 10, which includes a substrate 12 upon which the SNLC 10 is constructed. The substrate 12 may be removed after the SNLC film is made. A plurality of liquid crystal film layers 14 may be alternated with layers of an adhesive film 18, but the adhesive layer 18 may not be required. Many or all of the liquid crystal film layers 14 include liquid crystal monomers 16, and the liquid crystal monomers 16 are arranged in a defined pattern, according to the transmittance and reflectance characteristics desired of the resultant SNLC structure 10. As presented in FIGS. 1-2, the liquid crystal monomers 16 are in a particular pattern in each layer of the liquid crystal film 14, and it is important for the patterns to be sequentially arranged to achieve the desired performance characteristics.

FIGS. 1-2 present an example of the physical representation of periodic patterns described herein. FIG. 1 illustrates a basic design of a SNLC and the principles under which they operate. The SNLC may be a series of planes primarily composed of but not limited to liquid crystal molecules/monomers. Extra additives, such as photoalignment molecules, curable/cured polymers, chiral dopants, for holographic patterning, etc., may also be present depending upon the fabrication method. The orientation of the liquid crystal molecules, referred to as the liquid crystal director, is described by the liquid crystal director angles "θ" (see FIGS. 4A-8). For each layer of the SNLC, θ will vary as a periodic or aperiodic function depending upon its position on the helical axis referred to as "z". This can be achieved in various ways, e.g. field induces or mechanical rubbing/alignment layers. Additionally, if the liquid crystal layers are made from polymerized films, adhesive layers which may or may not contain aligned liquid crystal molecules may also be present to bind multiple layers of film together. Finally, the SNLC may be mounted upon any suitable substrate material, e.g. glass, plastic, metal, or semiconductor. The liquid crystal director in each layer would follow a pattern that matches the mathematical expressions for the waveforms disclosed herein, e.g. sine waves, cycloids, sinusoid, triangle, square. Also, the additive layer-by-layer approach may be replaced by a bulk approach if molecular dopants are used. Such molecules may be designed to mimic the desired structure and the liquid crystals would pattern according to the additives. This is similar to how a chiral molecule forces the nematics to align in a helical twist.

This concept has demonstrated to transmit light except in the region where narrow or broad reflection bands exists— the shape of these reflection notches are related to the index profile. The orientations of the liquid crystals have a longitudinal modulation using either linear or nonlinear waveforms, e.g. triangular, cycloidal, apodized, or chirped.

Swinging nematic liquid crystals have numerous applications, including photonics, optical switching, polarization control/filtering, band pass filters, notch filters, broad band linear polarizers, narrow band and broad band optical filters, pulse shaping, lens effects (focusing/defocusing), and LC displays.

The present invention offers numerous advantages and new features, including refractive index profiles that allow for tunable polarization dependence/independence (providing 100% tunable different orthogonal polarizations such as linear, circular, or elliptical) for normal and off-axis light propagation. This is in contrast to traditional cholesteric liquid crystals, which block one component of a pair of orthogonal polarization states, giving only a 50% reflection for unpolarized- or linearly-polarized light.

Linear and nonlinear patterning is demonstrated to overcome the limitations of traditional cholesteric liquid crystals, resulting in ~100% reflection regardless of polarization conditions.

SNLCs may include narrow and broad band 100% reflection notches (optical filters); the more advanced nonlinear patterning of the SNLCs (as opposed to simple sinusoidal patterning) offers ~100% tunable reflection notches that block linearly-polarized light.

Characteristics of some complex nonlinear patterns (waveforms), e.g. cycloidal, apodized, and chirped, are described below. Cycloidal-type patterns can be designed to display ~100% reflection of either the TM or TE (linear) polarization states. Individually, a cycloidal pattern behave as a simple linear polarizer, but specific patterns based on this type could also be used to produce a polarization independent band pass features. Apodized-type patterns suppress activity outside of the bandgaps (reflection bands) and sharpen the spectral edges. They may also expand the bandwidth of the bandgap features. Chirped-typed patterns (making the pitch a function of position) construct broadband gap features that may be used in broadband filter applications or for pulse shaping applications where an externally applied electric field could be used to modulate chirp profile. These may be extended to include 1-D, 2-D, and 3-D modulation (multidirectional, x, y, and z axes); effects may include more than reflection notches, e.g. diffraction, scattering, and lensing. Such devices may include a grating comprising at least one anisotropic material layer, wherein the orientation of the anisotropy axis in the material layer is rotating along at least two axes, and the rotation periodically changes sign for at least one axis.

As explained herein, the anisotropic layers are arranged in a periodic pattern of retardation values. The periodic pattern of retardation values may include zero (0). The anisotropic layers may be arranged in a periodic pattern of anisotropy axis orientation. The period of the periodic pattern of retardation values may vary across the film in a nonlinear manner. Figures labeled director angle (FIGS. 4A-6B) exhibit a single period of these patterns. FIGS. 7-8 are exceptions where multiple periods are illustrated.

As illustrated in the modeling explanation of FIG. 3, each pitch is subdivided into (in this case 100 slices) giving a slab thickness (h). The position ($z_m$) is discretized using half the slab thickness as the step size. The initial position ($z_0$) is set to zero. For each slice, the orientation angle is calculated as a function of the SNLC pitch and position ($\theta[p_0, z_m]$). The angle is used to calculate the matrix $P_m$ in each slice. In this example, for all patterns (triangular, square, sinusoidal, cycloidal), a total of 20 pitches were simulated by raising the calculated propagation matrix to the power of 20. To generalize the results, the simulations are performed as a function of wavelength to pitch ratio (r). The refractive indices used in the simulation are the same as the liquid crystal BLO38 ($\varepsilon_{xx}=3.236$, $\varepsilon_{yy}=\varepsilon_{zz}=2.328$). The boundaries are assumed to be glass ($\varepsilon_0=\varepsilon_2=2.281$). The field of two orthogonal polarization states e.g. right/left handed circularly polarized (RHCP/LHCP) or transverse magnetic and transverse electric linear polarization states (TM/TE), are calculated and used to determine the reflectance.

FIGS. 4A-4C illustrates reflectance characteristics for CLCs and SNLCs having a triangle wave pattern. FIG. 4A illustrates the director/orientation pattern angle of a single period of a CLC having a left-handed polarization (left) and the reflectance characteristics (right). FIG. 4B illustrates the director/orientation pattern angle of a single period of a CLC having a right-handed polarization (left) and the reflectance characteristics (right) for CLCs having a right-handed polarization. FIG. 4C illustrates the director/orientation pattern angle of a single period of a triangular SNLC (left) and the corresponding ~100% reflectance characteristics (right) for swinging nematic liquid crystals, according to the present invention. The triangle wave patterns represent the simplest SNLC. SNLCs tend to support a higher number of narrower band gap features than their CLC counter parts as a function of wavelength to pitch ratio. The bandwidth and number of harmonics can be increased or decreased depending on the magnitude of the triangular wave pattern.

FIG. 5 illustrates the director/orientation pattern angle of a single period of a SNLC having a square wave pattern (left) and the corresponding ~100% reflectance characteristics (right) typical for SNLCs, according to an embodiment of the invention. Square wave patterns have sharply defined peaks with only the nearest side harmonics possessing a significant amount of reflection. Since the behavior is very similar to isotropic dielectric stacks, much of that theory can be transferred in designing these types of dielectrics. There is zero net coupling between the two polarization states, resulting zero polarization dependence of the reflection spectrum.

FIGS. 6A-6B illustrate the director/orientation pattern angle of a single period of two types of SNLCs having cycloidal wave patterns (top and bottom left), according to an embodiment of the invention. Simulating TM/TE polarization states reveals that within the observed region of the reflectance characteristics (top and bottom right), the cycloidal pattern behaves like a reflective linear polarizer. As can be seen shifting the director angle by $\pm\pi/2$ will switch the linear polarization state reflected.

FIG. 7 illustrates the director/orientation pattern angle of a single period of two types of SNLCs having aapodized form of the sinusoidal pattern illustrated in FIG. 5 (left) and the corresponding ~100% reflectance characteristics (right) typical for SNLCs, according to an embodiment of the invention. An apodizing technique may be applied to sharpen the transmission spectrum and suppress oscillations outside the band gap.

FIG. 8 illustrates the director/orientation pattern angle of a single period of two types of SNLCs having a chirped form of the sinusoidal pattern illustrated in FIG. 5 (left) and the corresponding ~100% reflectance characteristics (right) typical for SNLCs, according to an embodiment of the invention. Chirping may be applied to create a strong bandgap feature.

FIG. 9 illustrates a double twisted NLC, a sub category of SNLC applied in a polarization transmission grating scheme, according to an embodiment of the invention. The SNLC system is similar to a slanted Bragg grating. Hence, reflection may be at an angle, and the SNLC system will be polarization independent.

FIG. 10 illustrates a double twisted NLC, a sub category of SNLC applied in a polarization transmission grating scheme. Included in the FIGURE is a simple formula for the liquid crystal director orientation (n) as a function of position (x,y), according to an embodiment of the invention.

FIG. 11 illustrates four distinct architectures of double twisted NLCs, according to an embodiment of the invention. The sign of the helical twist in x and/or y direction, indicated by the sign elements H and V respectively in the illustrated equation, can be varied to control the direction of propagation and polarization state of the output beam.

Fabrication of SNLCs

In a preferred embodiment, the spatially-modulated anisotropic structure comprising a swinging nematic liquid crystal structure comprises a plurality of liquid crystal polymer (LCP) layers. Of particular interest with regard to these LCPs is the high optical anisotropy, $n_a = n_e - n_o$, that can be obtained with these materials. Here $n_e$ and $n_o$ are the principal values of refractive indices of the LCPs. Since $n_a$ ~0.1-0.2, only a few LCP layers are necessary to provide high efficiency in diffraction/reflection. Another point of interest with regard to LCPs is their commercial availability due to their applications for LCDs. A wide variety of LCPs can be obtained, for example, from EMD Chemicals, marketed as RMS—reactive monomer solutions. Another point of interest with regard to LCPs relates to the ability to modulate the anisotropy axis orientation of LCPs at high spatial resolution in all three coordinates, including in the plane of the LCP film.

Fabrication of spatially-modulated anisotropic LCP structures to make a swinging nematic liquid crystal structure may include several steps: (1) deposition of an alignment material, including but not limited to photoalignment molecular monolayers of azobenzene and physically rubbed alignment layers (elvamide/polyimide/poly vinyl alcohol) over a substrate, (2) deposition of a liquid crystal monomer (reactive mesogen), (3) polymerization of the liquid crystal monomer, and (4) if desired, depositing subsequent layers of liquid crystal monomers wherein the orientation of the subsequent layers is different for subsequent LCP. There are several issues that must be addressed during the fabrication process including but not limited to minimizing the thickness of the alignment layer (so as not to alter the transmission), controlling the thickness of the liquid crystal monomer (to best match the desired SNLC pattern), optimizing exposure times of both layers (to fully align and lock in the liquid crystal layer), and removing trapped air (to minimize scattering).

The purpose of the alignment material is to provide alignment for the liquid crystal polymer. The thickness of the alignment material in the preferred embodiment is much smaller than the thickness of LCP layer. The alignment layer can particularly be a photoalignment material, e.g. PAAD series azobenzene dye, cinnamates, etc. When a photoalignment material is used, the fabrication process includes the following steps:

1. In the first step, a photoaligning material, such as PAAD series azobenzene dye commercially available from BEAM Co., is spin-coated on a fabrication substrate at about 3000 rpm for about 60 s. The spin-coated layers just need to achieve a desired thickness depending upon the desired SNLC profile. The fabrication substrate may be made of conventional BK7 or Fused Silica optical windows or any other optically transparent material. As mentioned above, polymeric photoalignment materials, e.g. based on cinnamates, may be used as well.

2. In the second step, the photoalignment layer is exposed to an expanded and collimated linear polarized light beam, for example an Ar-ion laser beam having a wavelength in the absorption band of the photoalignment layer. In case of PAAD series materials, the wavelength of radiation may be, for example, about 457 nm and the exposure time may be 10 min for 20 mW/cm$^2$ light power density.

3. In the third step, a liquid crystal reactive monomer solution, for example, RMS16-091 available from EMD Chemicals, is spin-coated over the photoalignment layer at a high rotation speed such as, for example, 8000 rpm for 60 s, although other speeds and times may be acceptable depending on the particular materials used.

4. In the fourth step, the reactive monomer layer is polymerized, for example, with unpolarized UV light of 365 nm wavelength. Non-UV light may also be used for this purpose, depending on the reactive monomer. There are monomers that polymerize using light in visible spectrum (450-800 nm) as well as the UV. Polymerization typically shall be performed in nitrogen atmosphere. The polymerization time may be 10 min for 15 mW/cm$^2$ UV light power density. Increasing the exposure intensity (mW/cm$^2$) will cut the time needed although it is not necessarily a linear relationship. The resulting LC polymer layer thickness can be verified by illuminating the LCP layer with a broadband optical/IR source (wider than the optical band gap) between crossed polarizers and viewing the transmission spectrum using a spectrometer. This depends on the desired position of the reflection notch/optical band gap; if a notch centered at 532 nm is desired, a visible light source will be used to monitor.

5. In the fifth step, the resulting LCP layer is coated again with the photoalignment material, and that coating is then photoaligned in the desired direction relative to the orientation of the first layer. The polarization of the collimated linear polarized light beam controls the alignment direction of the liquid crystal. Rotating the polarization in the direction 90° compared to the one used on the previous layer will produce a perpendicular photoalignment. Subsequent layers do not necessarily have to be perpendicular, however.

6. The steps 3 and 4 are repeated resulting in a second LCP film aligned orthogonally with respect to the orientation of the first LCP film.

The process can be continued several times until the bandgap reaches a value of interest. The values of interest can be determined by using the 4×4 matrix method simulations of the SNLC's pattern being fabricated. The presence of the bandgap can be verified taking the spectrum of the resultant film with unpolarized light. A sample spectrum in the mid-wave transparency region of the film is shown in FIG. 12.

The orthogonal orientation is discussed above by way of an example, and is not intended to be limiting. The preferred embodiment may use any other orientation condition between the layers.

In one of the preferred embodiments, the photoalignment may be performed by exposing the photoalignment material to a spatially non-uniform polarization pattern, for example, obtained in the overlap region of two circularly polarized coherent light beams.

An alternative technique for obtaining "swinging NLC" structures is based on producing the LCP films separately and transferring them onto a common substrate in a desired alignment condition.

In another preferred embodiment, each LCP layer is fabricated using chiral liquid crystal reactive monomer solutions (Ch-LCRMs). The first chiral LCP layer can be obtained, for example, by deposition left-handed Ch-LCMS. The second twisted LCP layer can then be obtained by depositing a right-handed chiral LCMS. The process can be repeated several times. LCMS layers are polymerized after each deposition. Photoalignment layers and procedures may be omitted in this technique. Chiral RM solutions are available, for example, from EMD Chemicals, however, they can be prepared or adjusted using commonly known chiral dopants of right or left handedness such as the chiral dopant CB15 available from Sigma-Aldrich or chiral dopant 811 available from Merck.

For bandgaps in infrared region of wavelengths, the fabrication can be performed using a regular glass substrate (BK7 or Fused Silica) followed by transfer of the layers to substrate transparent for infrared. Other substrates, such as crystalline materials can be used to reach spectral ranges that glasses cannot reach, even out to the long-wave infrared and THz regime.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A spectrally-selective reflective optical film comprising:
at least two anisotropic aligned nematic liquid crystal layers, with each layer having a portion of an optical axis orientation pattern in the same layer, each nematic liquid crystal layer comprising a patterned optical film defining a patterned refractive index, each portion of the optical axis orientation pattern being stacked to form a periodic refractive index pattern;
the optical axis orientation patterns of said nematic liquid crystals exhibiting a discontinuity at a boundary between adjacent layers, such that the optical film exhibits a tunable reflection of light in two or more polarizations simultaneously.

2. The optical film of claim 1, wherein at least a part of the anisotropic layers are chiral.

3. The optical film of claim 1, wherein the materials comprising the anisotropic layers are selected from liquid crystal polymers, azobenzene liquid crystal polymers, liquid crystals, azobenzene liquid crystals, polymer films with stressed birefringence, and combinations thereof.

4. The optical film of claim 3, wherein the materials comprising the anisotropic layers are doped with at least one dopant from the list comprising nanorods, photorefractive nanoparticles, photovoltaic nanoparticles, lasing dyes, and combinations thereof.

5. The optical film of claim 1, wherein the anisotropic layers are transparent to infrared wavelengths.

6. The optical film of claim 1, wherein the anisotropic layers are arranged in a periodic pattern of retardation values.

7. The optical film of claim 5, wherein the periodic pattern of retardation values includes 0.

8. The optical film of claim 1, wherein the anisotropic layers are arranged in a periodic pattern of anisotropy axis orientation.

9. The optical film of claim 6, wherein the period of the periodic pattern of retardation values varies across the film in a nonlinear manner.

10. The optical film of claim 1, wherein the at least two anisotropic layers have phase retardation values selected to meet a half-wave phase retardation condition for a laser wavelength.

11. The optical film of claim 1, wherein the periodic pattern formed by the at least two anisotropic layers is one of square, apodized square, triangle, apodized triangle, cycloid, apodized cycloid, and sinusoid.

12. The optical film of claim 1, wherein at least one of the characteristics of the anisotropic layers, phase retardation value, and optical axis orientation pattern, are controllable by optical radiation.

13. The optical film of claim 1, further comprising a transparent electro-conductive coating on at least one of the two anisotropic layers.

14. The optical film of claim 11, further comprising controlling the optical axis orientation pattern by the application of an electric field.

15. The optical film of claim 1, wherein the optical axis orientation patterns within the layers are at least two dimensional.

16. The optical film of claim 13, wherein the transparent electro-conductive coating comprises at least one of indium tin oxide (ITO), fluorine-doped tin oxide (FTO), aluminum doped zinc oxide (ZnO:Al), and other inorganic conductors, poly(3,4-ethylenedioxythiophene) polystyrene sulfonate (PDOT:PSS), polycarbazoles (PVK), polyfluorene, and other organic conductors.

17. A linear polarizer comprising the optical film of claim 1.

* * * * *